US 8,724,659 B2

(12) United States Patent
Andre et al.

(10) Patent No.: US 8,724,659 B2
(45) Date of Patent: May 13, 2014

(54) SYNCHRONIZATION OF VODSL OF DSLAM CONNECTED ONLY TO ETHERNET

(75) Inventors: Tore Andre, Alvsjo (SE); Anders Lindblad, Farsta (SE); Kenneth Johansson, Solna (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 1321 days.

(21) Appl. No.: 11/913,778

(22) PCT Filed: May 11, 2005

(86) PCT No.: PCT/SE2005/000686
§ 371 (c)(1),
(2), (4) Date: Dec. 28, 2007

(87) PCT Pub. No.: WO2006/121378
PCT Pub. Date: Nov. 16, 2006

(65) Prior Publication Data
US 2008/0212574 A1    Sep. 4, 2008

(51) Int. Cl.
*H04J 3/06* (2006.01)
*H04L 7/04* (2006.01)

(52) U.S. Cl.
USPC ........... 370/503; 370/509; 375/219; 375/220; 375/222; 375/223

(58) Field of Classification Search
USPC ............... 370/507–520, 252, 502; 379/27.01, 379/32.01, 32.04, 399.01, 93.05–93.06; 375/219–223, 344, 145, 149, 240.28, 375/293, 354–376
See application file for complete search history.

(56) References Cited

U.S. PATENT DOCUMENTS

| | | | |
|---|---|---|---|
| 5,544,163 A | 8/1996 | Madonna | |
| 5,898,744 A | 4/1999 | Kimbrow et al. | |
| 5,991,311 A * | 11/1999 | Long et al. | 370/524 |
| 6,026,074 A | 2/2000 | Stadler et al. | |
| 6,081,536 A | 6/2000 | Gorsuch et al. | |
| 6,137,778 A | 10/2000 | Yoshida | |
| 6,247,058 B1 | 6/2001 | Miller et al. | |
| 6,563,816 B1 * | 5/2003 | Nodoushani et al. | 370/352 |
| 6,580,727 B1 * | 6/2003 | Yim et al. | 370/463 |
| 6,771,763 B1 * | 8/2004 | Hagirahim et al. | 379/219 |
| 6,791,987 B1 | 9/2004 | Eng et al. | |
| 6,965,558 B1 * | 11/2005 | Hann | 370/216 |
| 7,088,722 B1 * | 8/2006 | Hann | 370/395.2 |
| 7,110,422 B1 * | 9/2006 | Choudhury et al. | 370/516 |
| 7,164,694 B1 * | 1/2007 | Nodoushani et al. | 370/467 |

(Continued)

FOREIGN PATENT DOCUMENTS

| | | |
|---|---|---|
| WO | WO 00/42728 A1 | 7/2000 |
| WO | WO 01/19005 A1 | 3/2001 |
| WO | WO 03/026179 A1 | 3/2003 |

*Primary Examiner* — Asad Nawaz
*Assistant Examiner* — Wutchung Chu

(57) ABSTRACT

A packet forwarding unit such as a Digital Subscriber Line Access Multiplexer (DSLAM) receives Ethernet packets carrying real-time information and forwards the information therein on output lines such as Asymmetric Digital Subscriber Lines (ADSLs). The DSLAM includes a clock device having an extraction unit and an adaptive clock. The extraction unit analyzes received packets to select streams of received packets from one destination to one user, and the adaptive clock generates a reference clock signal according to the arrival times of packets in the selected streams. The clock signal is sent to time reference units in DSL modems for the output lines.

12 Claims, 10 Drawing Sheets

(56) References Cited

U.S. PATENT DOCUMENTS

| | | | |
|---|---|---|---|
| 7,289,538 B1 * | 10/2007 | Paradise et al. | 370/497 |
| 7,307,980 B1 * | 12/2007 | Shah | 370/352 |
| 7,697,507 B2 * | 4/2010 | Rubinstain et al. | 370/352 |
| 8,085,787 B1 * | 12/2011 | Monteiro | 370/395.52 |
| 2001/0001616 A1 | 5/2001 | Rakib et al. | |
| 2004/0032780 A1 * | 2/2004 | Langberg et al. | 365/222 |
| 2004/0160949 A1 * | 8/2004 | Kim et al. | 370/352 |
| 2004/0177162 A1 * | 9/2004 | Wetzel et al. | 709/248 |
| 2004/0228431 A1 | 11/2004 | Kramer et al. | |
| 2005/0013304 A1 * | 1/2005 | Bouchat et al. | 370/395.21 |
| 2005/0025124 A1 | 2/2005 | Mitsumori et al. | |
| 2005/0141430 A1 * | 6/2005 | Borkowski | 370/241 |
| 2005/0175085 A1 * | 8/2005 | Bergen et al. | 375/240.01 |
| 2006/0013210 A1 * | 1/2006 | Bordogna et al. | 370/389 |
| 2006/0034320 A1 * | 2/2006 | Ripy et al. | 370/464 |
| 2006/0098625 A1 * | 5/2006 | King et al. | 370/352 |

* cited by examiner

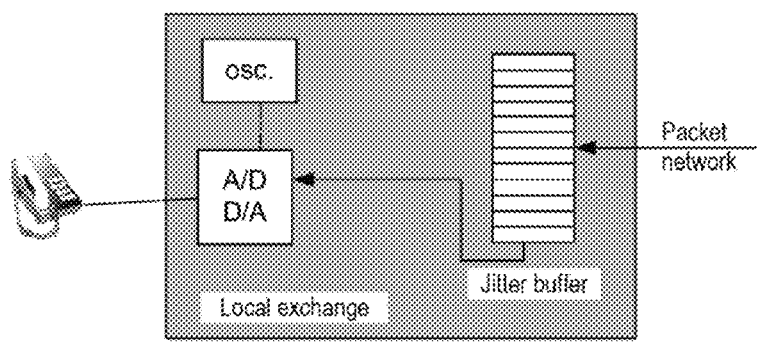
Fig. 4
(Prior Art)
Fig. 5
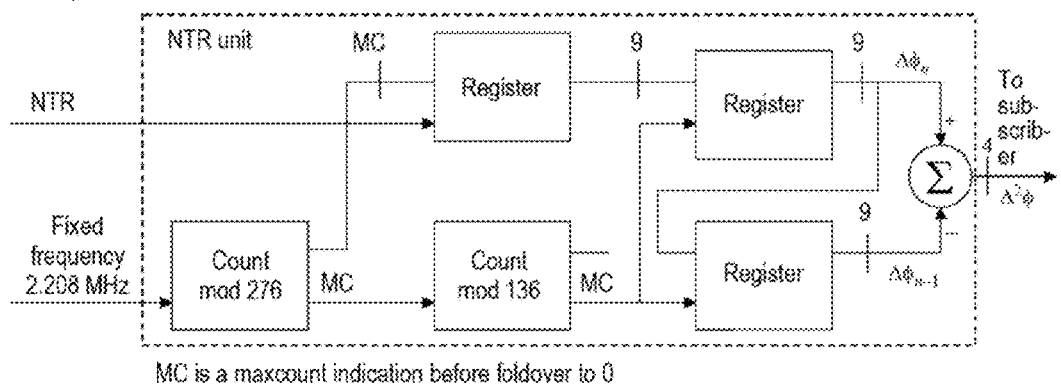
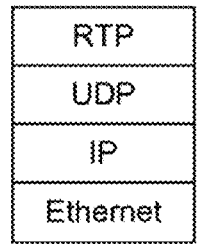
Fig. 8
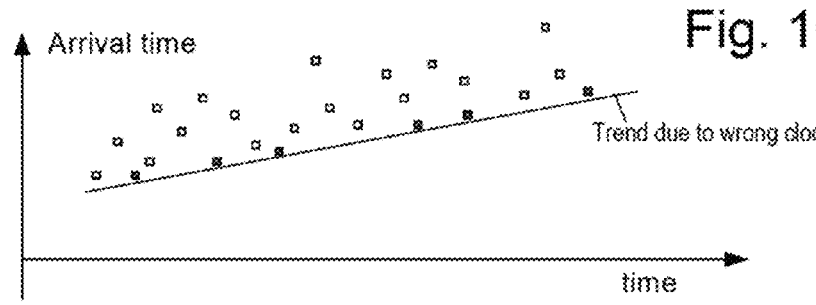
Fig. 10

SYNCHRONIZATION OF VODSL OF DSLAM CONNECTED ONLY TO ETHERNET

FIELD OF THE INVENTION

The present invention relates to a method and a device for synchronizing POTS (Plain Old Telephony Service) carried over DSLs (Digital Subscriber Lines), i.e. for VoDSLs (Voice over DSLs), the DSLs receiving data from a packet network, in particular an Ethernet network.

BACKGROUND

The digital PSTN (Public Switched Telephony Network), intended for primarily communicating voice information between two telephone sets, is a synchronous network, see FIG. 1. The A/D and D/A converters in the two line circuits at the ends of a connection, i.e. at the subscriber lines to the two telephone sets, use "the same" 8 kHz sample clock signal, see FIG. 2.

If a packet network using e.g. Ethernet is used for transport of the voice information over some portion of the path between the two telephone sets, see FIG. 3, no common reference clock signal is available that could be used by the A/D and D/A converters. The voice samples are transported in packets, the packets used also called frames according to Ethernet. The arrival times of the packets vary dependent on delay variations in the packet network. Then, jitter buffers at the receive ends are needed, see FIG. 4, to handle the delay variations. If clock signals that are not synchronized with each other are used in the A/D and D/A converters at the ends of an established connection the jitter buffers will sooner or later overflow or be empty. Voice samples have to be deleted or inserted to avoid this, where this correction involving deleting/inserting voice samples is usually called a slip. If the slip is inserted during a silence period of the voice communication it will not be detectable to the person receiving the voice message.

However, for example some devices like ordinary telephone modems for communicating data or facsimile are sensitive to slips and clock jitter. Hence, many modems will retrain when a slip occurs. Also DTMF signals are disturbed by a slip.

POTS traffic, i.e. usual voice information, on a physical subscriber line or link also carrying an ADSL (Asymmetric Digital Subscriber Line) for communicating digital information is usually transferred in an own frequency band, obtained by splitting the available frequency band using analog splitting filters. The ADSL uses a band of frequencies from 25 kHz up to 1.1 MHz, or up to 2.2 MHz for the standard ADSL2+, and the POTS uses the normal POTS frequencies.

In VoDSL the POTS instead sends voice information coded as digital data within the ADSL payload. Then, the POTS CODEC (PCM Coder Decoder) is situated at the subscriber side of the ADSL link. The POTS CODEC needs an 8 kHz reference clock signal, such reference clock signals herein called simply "clock signals" or "clocks".

Advantages of VoDSL include that if POTS uses the digital band, the normal POTS frequencies can be used for data and that no frequency splitting filters are needed.

For providing a reference clock for decoding voice information at the receive end of a communication path including a packet transport network a free running oscillator can be used. However, the expected accuracy of a low cost oscillator is in the order of 100 ppm, giving a slip-rate of one slip on 104 samples, i.e. one every 1.25 second. This is not acceptable for a high quality POTS system. In IP networks the network timing protocol (NTP) is used to synchronize nodes and it can be used for timing recovery, see published International patent applications Nos. WO 00/42728 and 02/39630 for Telefonaktiebolaget L M Ericsson and corresponding U.S. Pat. Nos. 6,532,274 and 6,711,411, inventor Stefano Ruffini. The standard IEEE 1588 is a level 2 method (Ethernet) for providing a clock signal. It requires Ethernet all the way, i.e. no routers can be connected in a connection path.

Various methods exist for generating a clock signal, such as from received packets, some of them requiring specially designed packets or non-standard Ethernet equipment. There is a need for methods that have a high performance and can use the existing packet streams in an Ethernet transport network.

"Adaptive clock" is a generic name for methods that regenerate a clock from packet timing. Some of these methods are point-to-point methods that work transparently through different sorts of network equipment like switches and routers. The quality of the regenerated clock is very much dependent on the variation of the delays of the packets. In e.g. a switch a packet carrying voice information might have to wait until a long data packet is transmitted. The time that the packet has to wait is proportional to the length of the data packet and the speed, e.g. in bits/s, of the link. The maximum length of Ethernet packets is 1500 bytes. In a 100 Mbit/s Ethernet link this corresponds to 120 µs and in Gigabit Ethernet it corresponds 12 µs. In an ADSL link the speed is much lower, e.g. 0.5-8 Mbit/s. Thus, e.g. a speed of 0.5 Mbit/s corresponds to 24 ms for an Ethernet packet of maximum length. Obviously, in that case the delays due to long data packets are much higher. This means that the delay variation of packets after a DSL link is increased and that adaptive clock methods over the ADSL link are less useful.

In the ADSL standard ITU-T G.992.1 the transfer of an 8 kHz timing reference signal is described. In a voice over DSL case the reference clock, available in the DSLAM, can be connected to the NTR (Network Timing Reference) unit and transferred to the customer. ADSL is originally designed for an ATM interface and in that case an 8 kHz reference signal is usually available from the ATM network.

In the NTR units a phase difference between the 8 kHz clock and the ADSL sample clock, that is obtained by dividing a transmit clock of 2.208 MHz by 276 to obtain the 8 kHz signal, see FIG. 5, is produced and a value thereof is transmitted to the customer.

In the case where the DSLAM (DSL Access Multiplexer) used in the uplink end of an ADSL is only connected via Ethernet such a reference clock in not available which is the case considered herein.

SUMMARY

It is an object of the invention to provide a forwarding unit such as a DSLAM that receives Ethernet frames and produces a reference clock signal for use on a digital subscriber line, in particular an ADSL.

It is another object of the invention to provide a method of producing, from a received stream/received streams of Ethernet frames, a reference clock signal for use on a digital subscriber line, in particular an ADSL.

Generally, the method uses arrival time of RTP packages to generate the reference clock signal.

In a voice over DSL case, the voice information is transferred digitally in the ADSL bitstream, a reference clock is generated using an adaptive clock method and connected to the NTR input of the ADSL modem. Thus, an 8 kHz reference clock signal can be regenerated at the subscriber side.

As soon as e.g. a voice call is initiated packets useful for synchronization will be available, a synchronization process can be initiated and the reference clock signal transferred to the customer or subscriber using NTR.

The ADSL DSLAM investigates the packet stream going to the ADSL subscriber. As soon as a stream of voice packets or another real time service that is synchronous to the PSTN network, e.g. a videoconference, is identified it is used in the synch process. Such data streams can be identified e.g. using the VLAN tags, the IP source addresses, the port number of their packets or frames or by identifying the RTP contents thereof. The DSLAM might also be directed from another system which packets to use. If several streams are available one or several streams can be used. Preferably, the stream with the lowest delay variation is used.

Generally, a forwarding unit such as a DSLAM is adapted to receive Ethernet packets and to forward them or information contained therein on digital subscriber lines. For forwarding voice information contained in received Ethernet packets a reference clock signal is generated by a clock device and provided to modems for the digital subscriber lines. The clock device includes an extraction unit for selecting at least one stream of received Ethernet packets, and a clock signal generating unit, configured as an adaptive clock unit or generator, for generating a reference clock signal according to arrival times of packet in selected packet stream or streams. The reference clock signal can be provided to time reference units in the modems. The extraction unit can analyze received Ethernet packets to find streams of packets from one destination to one user, the packets of each of the streams carrying real time information belonging to a real time service and then select one or more streams to be used by adaptive clock generator.

BRIEF DESCRIPTION OF THE DRAWINGS

The invention will now be described by way of non-limiting embodiments with reference to the accompanying drawings, in which:

FIG. 4 is a block diagram of a local exchange connected between a packet network and a telephone network and including a local oscillator, A/D and D/A converters and a jitter buffer for handling varying delays of arrived packets, FIG. 5 is a block diagram of an NTR unit for use in DSL modems, FIG. 7 is a block diagram of a DSLAM arranged for communicating voice information on digital subscriber lines, FIG. 8 is a diagram of protocols or protocol handling circuits.

DETAILED DESCRIPTION

Figure 1:
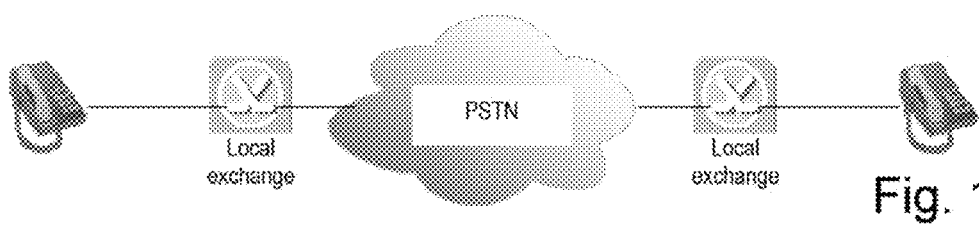
FIG. 1 is a schematic of communicating voice information between two telephone sets over a digital public switched telephony network.
Figure 2:
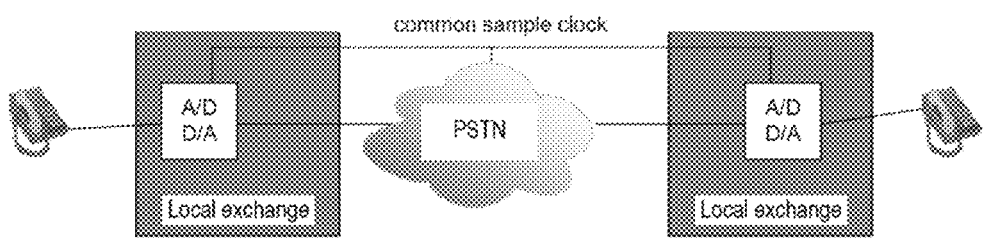
FIG. 2 is a schematic similar to FIG. 1 illustrating also A/D and D/A converters located in local exchanges at the ends of a connection between two telephone sets.
Figure 3:
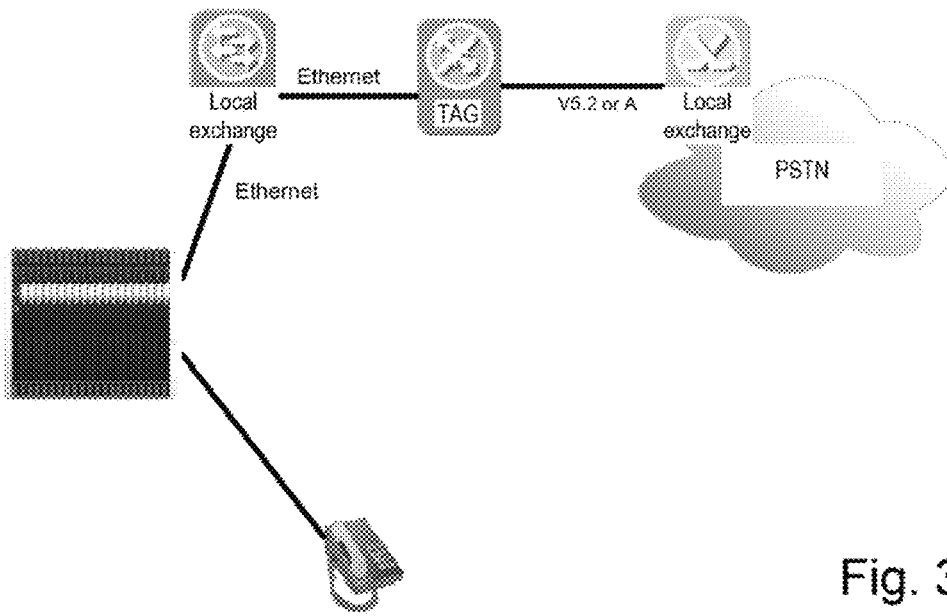
FIG. 3 is a schematic of communicating voice information from/to a telephone set where a packet network using e.g. Ethernet is used for transporting the voice information over some portion of the communication path.
Figure 6:
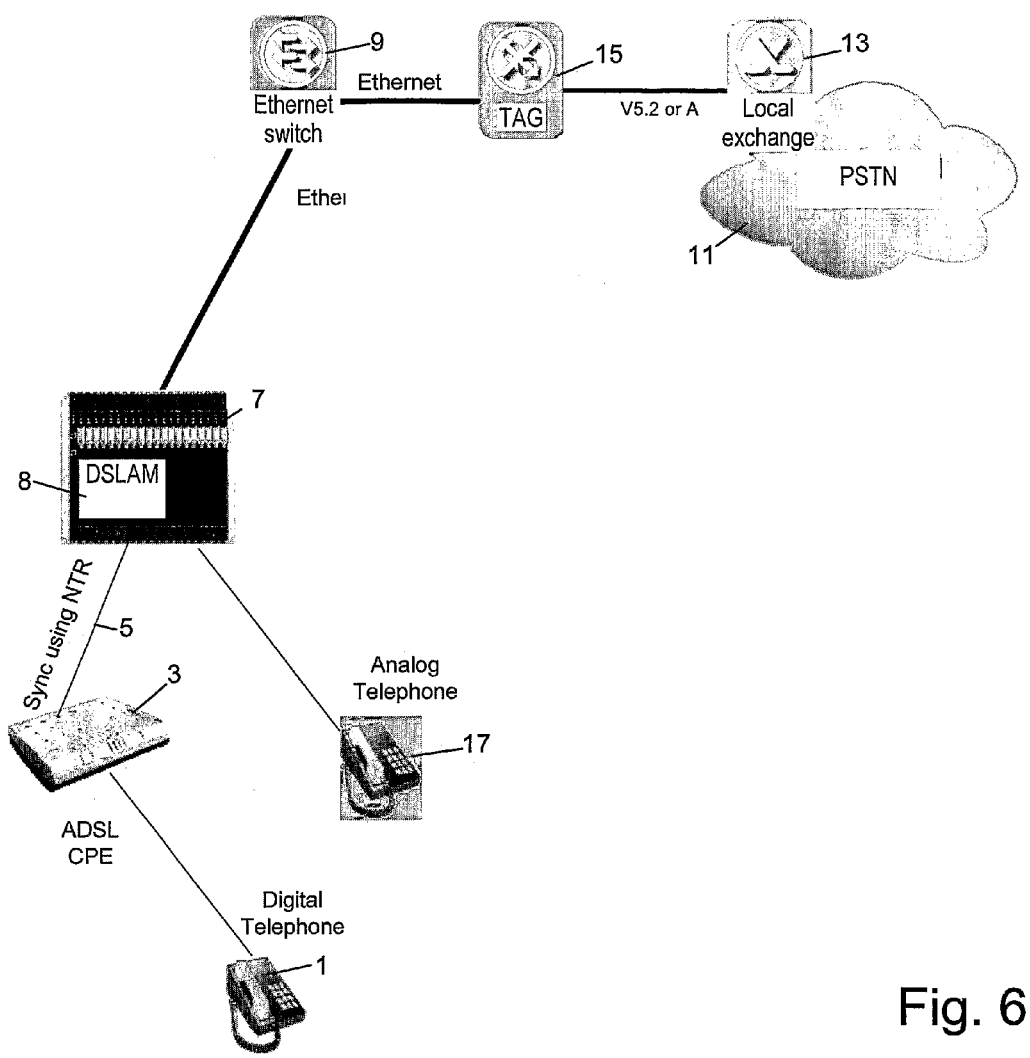
FIG. 6 is a schematic similar to FIG. 3 illustrating also a digital telephone set connected through an ADSL link to the public switched telephony network.

In FIG. 6 a system is schematically illustrated in which voice information is communicated through an Ethernet network and an ADSL. A digital telephone set 1 is through an ADSL modem 3 and a line 5 carrying an ADSL link connected to a special interface node 7 also holding an ADSL modem, not shown. The node 7 and its ADSL modem is through an Ethernet network symbolically illustrated by the Ethernet switch 9 with the PSTN 11. The PSTN is connected to the Ethernet network at a local exchange/switch 13 and a TAG (Telephony Access Gateway) 15. The TAG places the voice samples in the Ethernet frames and retrieves the voice samples from received Ethernet frames. A plurality of digital telephones can generally be connected to the same interface node 7, suitably to a DSLAM 8 included therein. Analog telephone sets 15 can also be connected to the special node 7 provided that it has the necessary functions such as e.g. A/D and D/A converters.

In the block diagram of FIG. 7 a DSLAM 8 is illustrated that is connected to the Ethernet network at a network port 21. The DSLAM includes a plurality of individual DSL modems 23, each having an NTR unit 25 and connected to subscriber lines 27. Furthermore, the DSLAM 8 includes functions, not shown, for routing Ethernet frames received from the network port 21 to the correct one of the DSL modems and to forward digital information from the DSL modems received from the subscribers to the network port.

The DSLAM 8 includes a clock device 28 containing an extraction unit 29, also called selection unit, for extracting, in the preferred case, a single packet stream selected among generally a plurality of packet streams incoming on the network port 21. For that purpose the extraction unit can be connected to suitable ones of protocol handling units of the DSLAM, not shown. Generally, the extraction unit 29 is continuously investigating the packet streams to the ADSL subscribers. As soon as a stream of voice packets or another real time service that is or can be assumed to be synchronous to the PSTN network 9, e.g. a stream of packets for a videoconference, is identified it can be used in the synchronization process.

The selection of a suitable packet stream can be done in several ways. The selection is basically done by investigating things like IP addresses, port numbers and VLAN tags of the received packets. Some examples are given below.

1. POTS traffic can be communicated in a separate VLAN in order to be able to prioritize between voice and data traffic. The VLAN tag is a part of the header of Ethernet packets and it can be used to distinguish and select voice traffic.
2. The DSLAM 8 can know the IP address of a TAG 15 and then filter out packets coming from this IP address.
3. The POTS traffic to a special telephone has a unique PORT number and it can be used to distinguish voice traffic.

A combination of several criterions may be required to find packet streams suitable for synchronization. This process can be called "filtering the incoming Ethernet packet streams". To find filtering criterions three basic methods can be mentioned:
1. In a transparent mode the extraction unit 29 itself has to determine the filtering criterions to be used. This can be done in two ways:
a. Signaling snooping. In this case, the extraction unit searches for signaling packages, i.e. packages containing information about call setup. This kind of information is usually transferred using e.g. the SIP protocol, H.323 or H.248. The signaling is analyzed and suitable POTS streams are selected.
b. Blind search. In this case a blind search for RTP packages is performed. RTP packages have no unique header and therefore, it is not possible to detect them in a simple way. However, it is possible to find an RTP stream by looking for some special characteristics, such as:
i. Packet size. Ethernet packages carrying voice information have a certain length, usually 40, 80 or 160 bytes plus a fixed overhead.
ii. Incrementing timestamps. The RTP header contains a timestamp that is incremented by 40, 80 or 160 for each packet depending of the number of bytes per packet. This can be used to find probable RTP streams.
2. In a proxy mode, the DSLAM 8 takes part of the signaling and is aware of the different streams. The customer equipment such as the ADSL modem 3 talks to the DSLAM and the DSLAM talks to the TAG 15.
3. In a slave mode the DSLAM 8 is informed about available streams from a supervising system, not shown. This system can use a suitable protocol such as SNMP to inform the DSLAM about available packet streams and/or the filtering criterions to be used.

If several suitable streams are available one or several streams can be used. Preferably, however, the stream with the lowest delay variation is used.

The protocols assumed to be used for the packets in the Ethernet network are from the bottom Ethernet, IP, UDP and RTP, see FIG. 8. The RTP provides information regarding sequence number and time stamp, as inserted by the TAG 15. The timestamp is used to relate a packet to a real point in time. The timestamp is incremented by the packetizing interval times the sampling rate. For example, for voice packets containing 20 ms, which corresponds to 50 Hz, of speech sampled at 8,000 Hz, the timestamp for each block of speech samples increases by 160, even if the block is not sent due to silence suppression. It is assumed herein that there is one RTP package in each Ethernet frame. Hence, in this example RTP-frames of a single stream should arrive with a frequency of 50 Hz. From the arrival times it is determined whether the reference clock signal should have a frequency selected among values generally close to the nominal value of 8,000 Hz.

Figure 9:
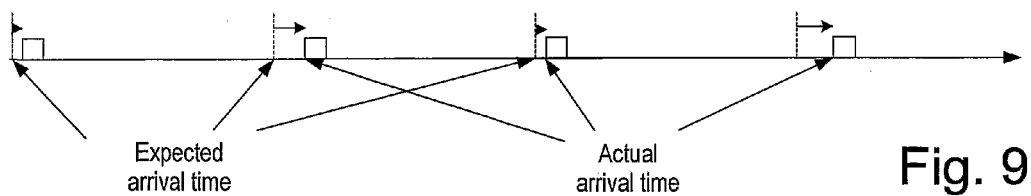
FIG. 9 is a diagram illustrating delays of packets received from a packet network.
Figure 10:
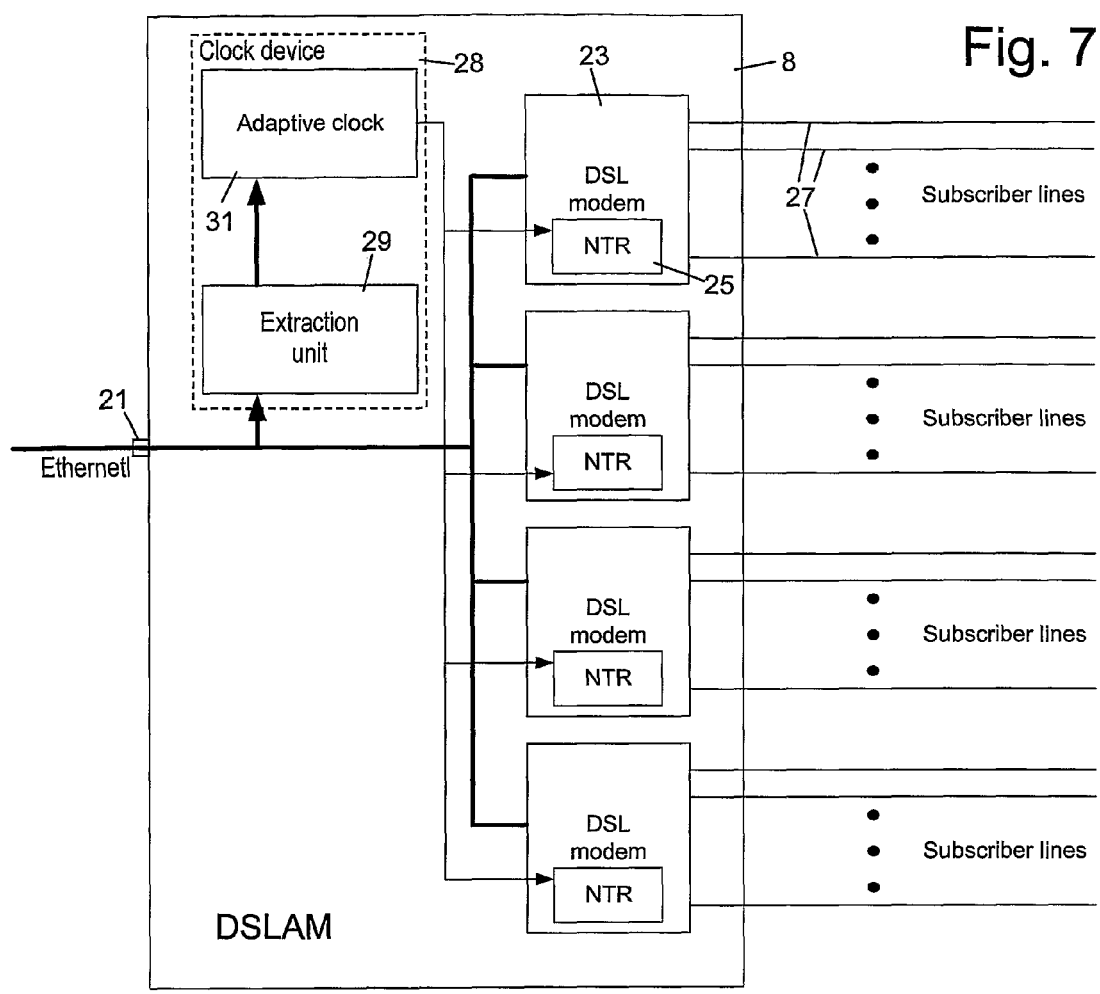
FIG. 10 is a diagram illustrating a trend of delays in relation to clock reference signal for delays of packets received from a packet network.

The Ethernet frames in a stream containing RTP packages could in an ideal case be supposed to arrive at equal distances. However, due to delay variation in the transport network random delays are added to the expected arrival times. Such random delays can be considered as a noise source in a timing recovery system, see FIG. 9. The noise is always positive but still a trend can be estimated, see the diagram of FIG. 10. The sloping line denoted by "Trend due to wrong clock" of FIG. 10 indicates in the case shown that the reference clock signal used has a little too high frequency. The line should in the ideal case coincide with or be parallel to the abscissa axis of the diagram.

Figure 11:
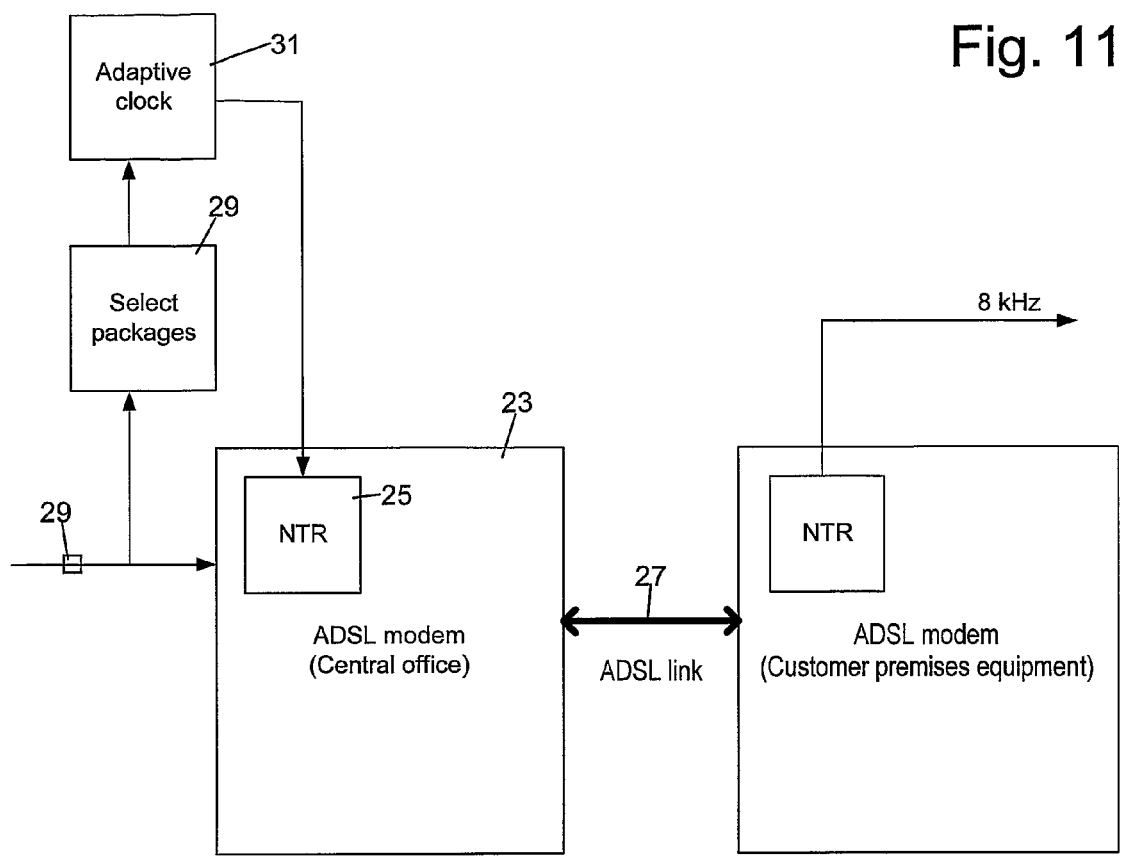
FIG. 11 is a block diagram of circuits required for forwarding digital information including voice information over an ADSL link where a generated reference clock signal is used as a network time reference signal.

The extraction unit 29 controls a clock generating unit that is configured as an adaptive clock generator 31 in the clock device 28, see FIGS. 7 and 11, and provides a common clock signal to the NTR units 25 of the DSL modems 23. The adaptive clock generator generates an 8 kHz reference signal having an adapted frequency or phase. It can be constructed in various ways and in the following a device using both analog and digital functions and a device using only digital functions will be described.

Figure 12:
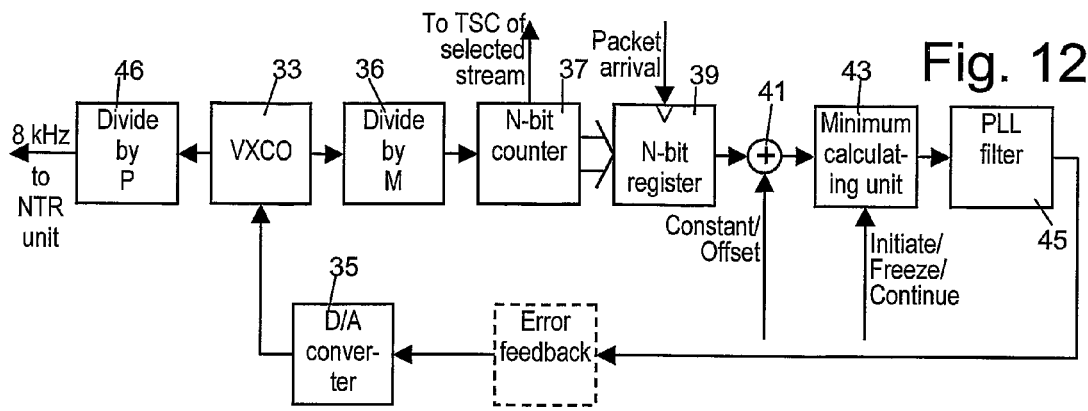
FIG. 12 is a block diagram of an adaptive clock unit including a PLL and an adjustable oscillator.

In the block diagram of FIG. 12 the main functions of an adaptive clock generator are shown in which a PLL (Phase Locked Loop) is used to regenerate the 8 kHz sampling clock. In the clock generator a VCXO (Variable frequency crystal oscillator) 33 is used together with a D/A converter 35. The generated clock signal is provided to the NTR units 25 of the DSL modems. As seen in FIG. 12 the PLL includes the VCXO 33, a prescaler 36, an N-bit counter 37, an N-bit register 39, an adder 41, a minimum calculating unit 43, a PLL filter 45 and the D/A converter (DAC) 35. The reference clock signal to the DSL modems is provided by a down-scaling unit 46 receiving the pulses from the oscillator 33.

The arrival time of each received Ethernet frame is measured using an internal timer in the extraction unit 29. The clock for the timer is a reference signal provided by the oscillator 33 which in this embodiment is a controlled or adjustable oscillator. The arrival time is stored for later analysis in order to determine if the packet is useful for synchronization. Actually, the arrival time is determined as the deviation, counted in some clock pulses, from an expected time, the expected time provided by the internal timer.

The internal timer is an N-bit timer making a full count in the same time as the time distance between two packages, i.e. as the time intervals between the starts of successive packages, i.e. the timer will wrap around once per frame containing an RTP packet of a stream. The actual arrival time of a packet can be anywhere in the interval, compare the diagram of FIG. 13.

Figure 13:
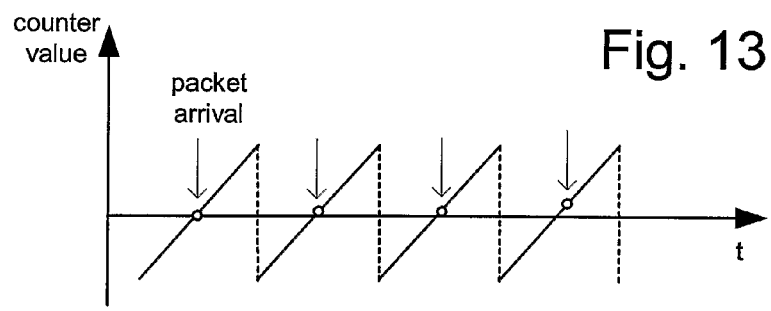
FIG. 13 is a diagram illustrating values of a delay measuring counter and arrival times of packets.

In the embodiment of FIG. 12 the VXCO 33 provides pulses of a high frequency such as 32.768 kHz in an example, the pulses down-scaled by the prescaler 36 by division by a number M, e.g. 10, the prescaler providing pulses to the counter 37, in the example a 15-bit counter, to be counted thereby, and the counter providing values such as those that appear from the graph of FIG. 13. The down-scaling factor of the prescaler must be chosen in such a way that the N-bit counter 37 wraps around every packet period, i.e. 10 ms if the packet size is 10 ms. The arrival time of the frames should be at the same position in the counting interval, i.e. on a line parallel to the abscissa axis. When packets arrive the actual value of the counter 37 is transferred through the adder 41, where a constant is added, to the minimum calculating unit 43 and stored. This unit calculates a minimum value that is provided to the PLL filter 45 which in turn outputs a value for control of the VCXO 33, this value first converted to an analog value by the DAC 35.

To get the same, e.g. a zero output from the arrival time determination in a steady state, i.e. when the system is in exact synchronization, a synchronization offset is by the adder 41 added to the value counted by the counter 36 in such a way that the expected arrival time will have the same value, e.g. be equal to zero in the example, i.e. at the start of the counting interval. If e.g. the timer value at expected packet arrival is equal to 0x7000 an offset value of 0x9000 is used. The sum of these values wraps around and gives the desired result of 0x0000. The synchronization offset is calculated once in the first synchronization operation, and also in each resynchronization operation when a new stream is used for generating the reference clock.

Figure 14:
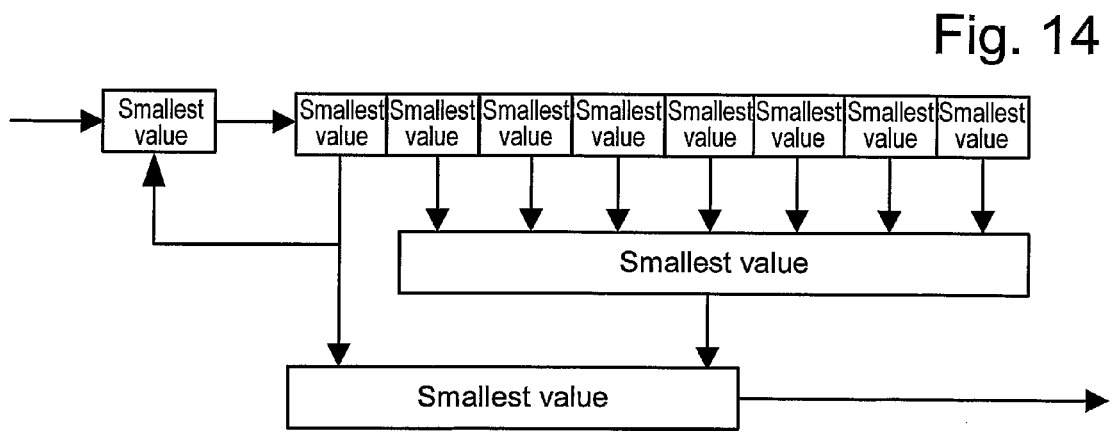
FIG. 14 is a block diagram of a minimum value calculating unit using a sliding window algorithm and grouping or blocking of received values.

The minimum calculating unit 45 can for a block of consecutive packets, such as for all packets of the stream received during a substantial time period, typically one or more seconds, use the packet that has arrived with the smallest delay as an estimate of the true arrival time, i.e. it can use a minimum value algorithm to find the smallest value of a set of values for finding the packet with the lowest delay. The algorithm can be implemented as a conventional sliding window minimum value algorithm, see FIG. 14.

Figure 15:
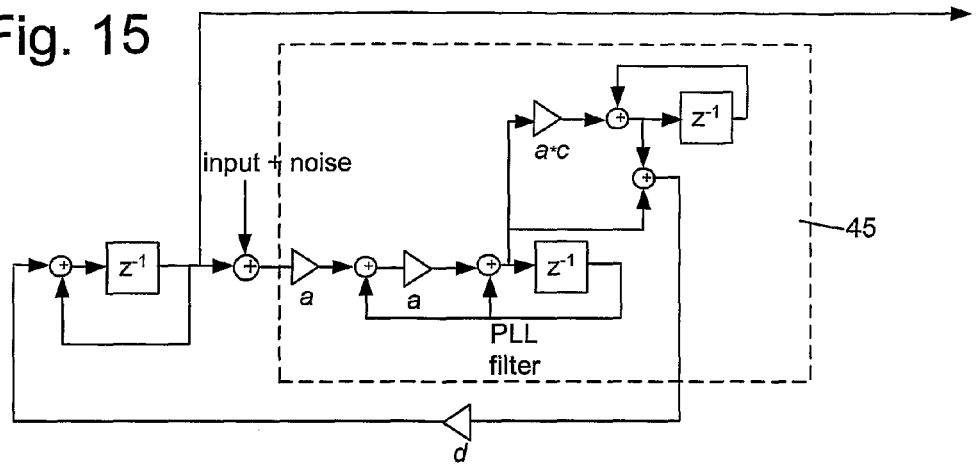
FIG. 15 is a circuit diagram of a PLL filter.

The PLL filter 45 is a low-pass filter and makes its calculations once for every new packet, e.g. 100 times per second if 10 ms packages are used and no packages are lost, see FIG. 15. At start-up the PLL filter 45 contains zero, this corresponding to a high limit frequency, and the frequency of the VXCO 33 is set to a middle value, e.g. a frequency corresponding to a generated reference clock signal of exactly 8 kHz. The minimum value algorithm is allowed to be running for e.g. about 1 second and the minimum arrival time delay is calculated. A synchronization offset value is calculated and used as the constant added in the summing circuit 41.

In a resynchronization operation the PLL filter 16 is not reset, i.e. it maintains the same filtering characteristics, but a new synchronization offset value is calculated to be used as the constant added in the summing circuit 41 by running the minimum value algorithm in the minimum value calculation unit 43 for e.g. about 1 second.

When the RTP stream used for synchronization stops the PLL filter 45 is frozen, i.e. it maintains the same filtering characteristics as before, and a new stream of frames is selected for synchronization and a resynchronization operation is performed to find the new synchronization offset. Also in the case of silence suppression the RTP flow can disappear for some time period and then it can be advantageous to change the packet stream used for synchronization.

When all RTP streams disappear the PLL filter 45 and the clock frequency of the VXCO 33 are frozen, i.e. are kept unchanged, until a new RTP stream is found and selected. When a new RTP stream occurs a resynchronization operation is performed.

Several conditions have to be fulfilled in order to approve a package for usage in the synchronization algorithm.
1. It has to be an Ethernet frame containing an RTP package belonging to the stream that is currently used for synchronization.
2. The package has to belong to the right time period, i.e. the RTP timestamp of the package has to match a local time stamp counter (TSC), as will be described below.

Each RTP package contains a time stamp in its header. This timestamp is, by the TAG 15, incremented by the number of speech samples in the package for every new package. The local time stamp counter is incremented the same way once every expected packet period. It can be implemented as a hardware or software counter coupled to a timer unit that includes the oscillator 33 and the N-bit counter 37.

Initially, the timestamp from a received RTP package of the selected stream is loaded into the TSC. Each time a package arrives the timestamp in the RTP header is compared to the value of the TSC and if they are equal the package is approved for use in the synchronization algorithm.

If K consecutive timestamps have values smaller than the corresponding value of the TSC, the TSC is resynchronized with the new value. If L consecutive timestamps have values smaller than the corresponding value of the TSC, the TSC is also resynchronized with the new value. K, L are predetermined, suitably chosen numbers.

The synchronization algorithm contains a number of parameters. Some of them have to be adjusted according to the current situation. Other parameters can be used to change the behavior of the synchronization algorithm.

The window size used by the minimum calculating unit 43 in determining the minimum value determines the number of packets that are evaluated to find the packet arrived with the lowest delay. A large value of the window size increases robustness of the PLL but reduces the capability of fast response. There is a relation between the window size and the time constant of the PLL filter 45. If the window is too large compared to the time constant the loop can become unstable. The window size shall be kept so that the time period to which it corresponds is much smaller than the time constant of the PLL filter.

The clock frequency generator can either be implemented as a voltage controlled crystal oscillator VCXO, as described above, or using an oscillator having a fixed frequency and a digital frequency adjustment, i.e. a digital controlled oscillator (DCO).

Figure 16:
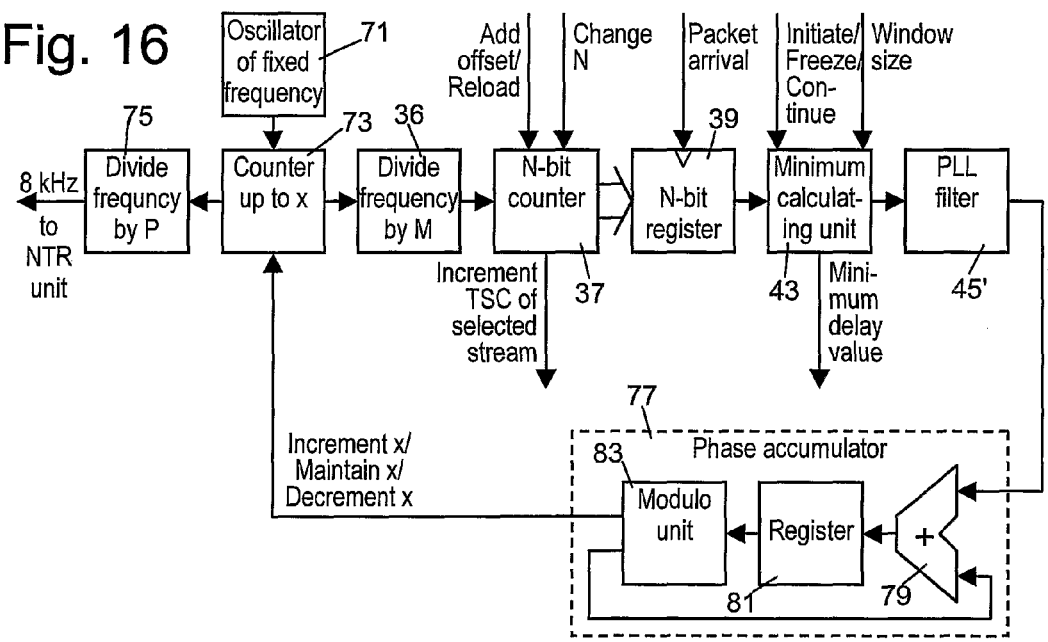
FIG. 16 is a block diagram similar to FIG. 12 but including an oscillator having a fixed frequency.

The adaptive clock frequency generator includes in a possible implementation using a DCO, see FIG. 16:
1. A clock generator 71 which is a crystal oscillator with a fixed frequency that is a multiple of 8 kHz, e.g. 6.32.768 MHz.
2. A counter 73, a counter that divides the signal from the clock generator 71 by an adjustable number x. Thus, the counter thus has an adjustable maximum value so that when this value is reached the counter outputs a pulse and the counter starts counting from its start value, the start and maximum values being 0 and (x−1), respectively in the conventional way. Hence it can be said that the frequency of the output clock signal is externally controlled by dividing it by slightly different factors, thereby generating small adjustments of the frequency of the reference clock signal. In an example the number x can take the values 5, 6, 7 where 6 is the "normal" or "nominal" value.
3. A dividing unit 75 providing the desired reference clock signal of e.g. nominally 8 kHz, this being the signal provided to the NTR units. The dividing unit 74 that is basically a counter reduces the output signal of the counter 73 by dividing it by a suitable number P, in the example this unit being a 16-bit counter and then P=65,536.
4. A frequency divider 36, which divides the signal output from the counter 73 by a number M, in the example M=10.
5. An N-bit counter 37 receiving the signal from the frequency divider 36, the number N determined so that the counter wraps around at the packet frequency of e.g. 50, 100 or 200 Hz.
6. An arrival time measurement unit 39 that is connected to receive the value of the counter 37 and has the function of reading the counter every time when a packet of the selected stream arrives so that the same value will come out every time when a packet arrives exactly at the expected time.
7. A minimum calculating unit 43 that is connected to the arrival time measurement unit 37 and is used to sort out packets arriving with low delays and to produce a control signal indicating a "best" expected delay of packets in the selected stream, e.g. the lowest delay within a sliding window.

8. A PLL-filter 45' which is connected to the minimum calculating unit 43 to receive the control signal and is a low pass filter for smoothing the control signal.

9. A phase accumulator 77 that accumulates phase errors as received from the PLL filter 45' until it is time for an adjustment of the frequency output from the counter 73, i.e. of the wrap-around value thereof. The phase accumulator includes an adder 79, a register 81 and a modulo function block 83. The modulo function—modulo some suitable number z—makes the phase accumulator "wrap around" at overflow or underflow, this at the same time producing a phase adjustment of the adjustable counter 73, i.e. changing the currently used number x to (x+1) or (x−1), respectively.

In a resynchronization operation the N-bit counter 37 can be reloaded with a new calculated value or an offset value can be added to the contents thereof.

Figure 17:
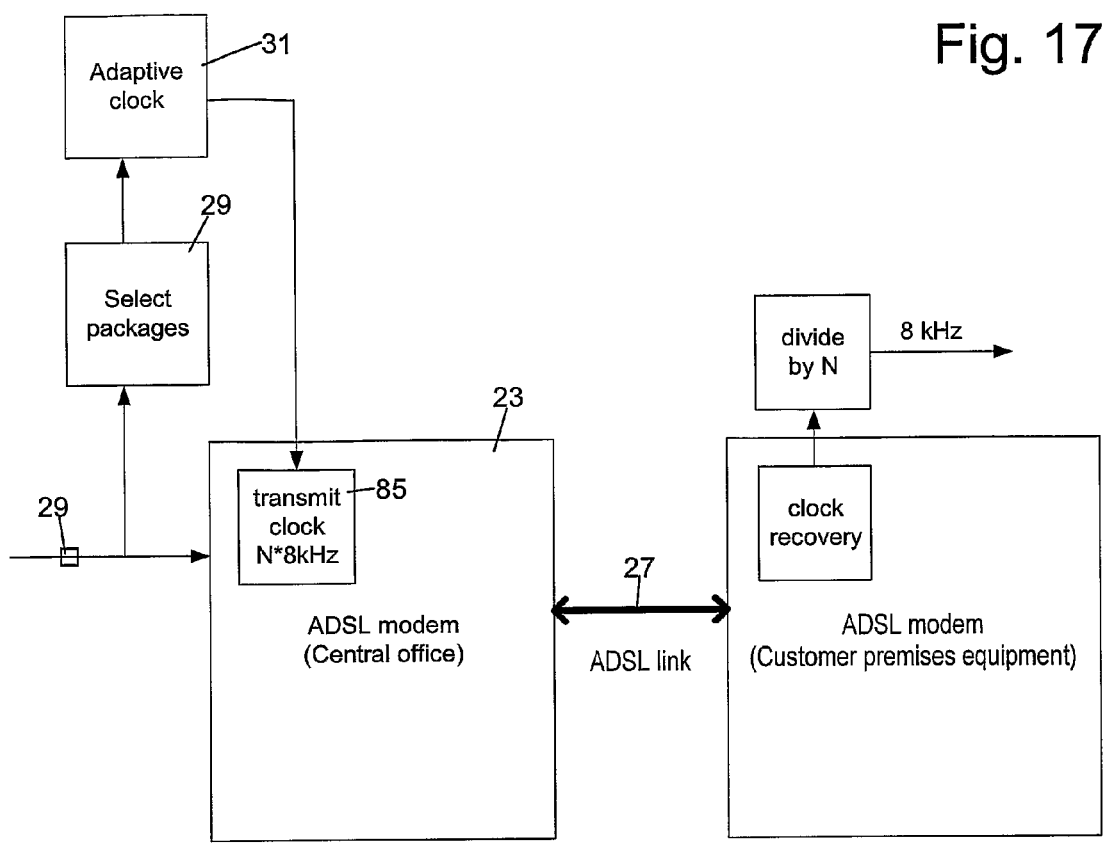
FIG. 17 is a block diagram similar to FIG. 11 where a generated reference clock signal is used to control a transmit clock.

As seen in the block diagram of FIG. 17, instead of the case described above in which the NTR clocks are adjusted according to the clock recovered from the packet stream, the ADSL clocks 85 themselves can be adjusted. In the latter case the NTR is not used but the ADSL clock will be adjusted to be synchronous with 8 kHz clock. The adjustments to the ADSL clock has to be very small and slow in order not to affect the ADSL performance, this being achieved by selecting parameters of e.g. the PLL-filters 45, 45' accordingly.

Figure 18:
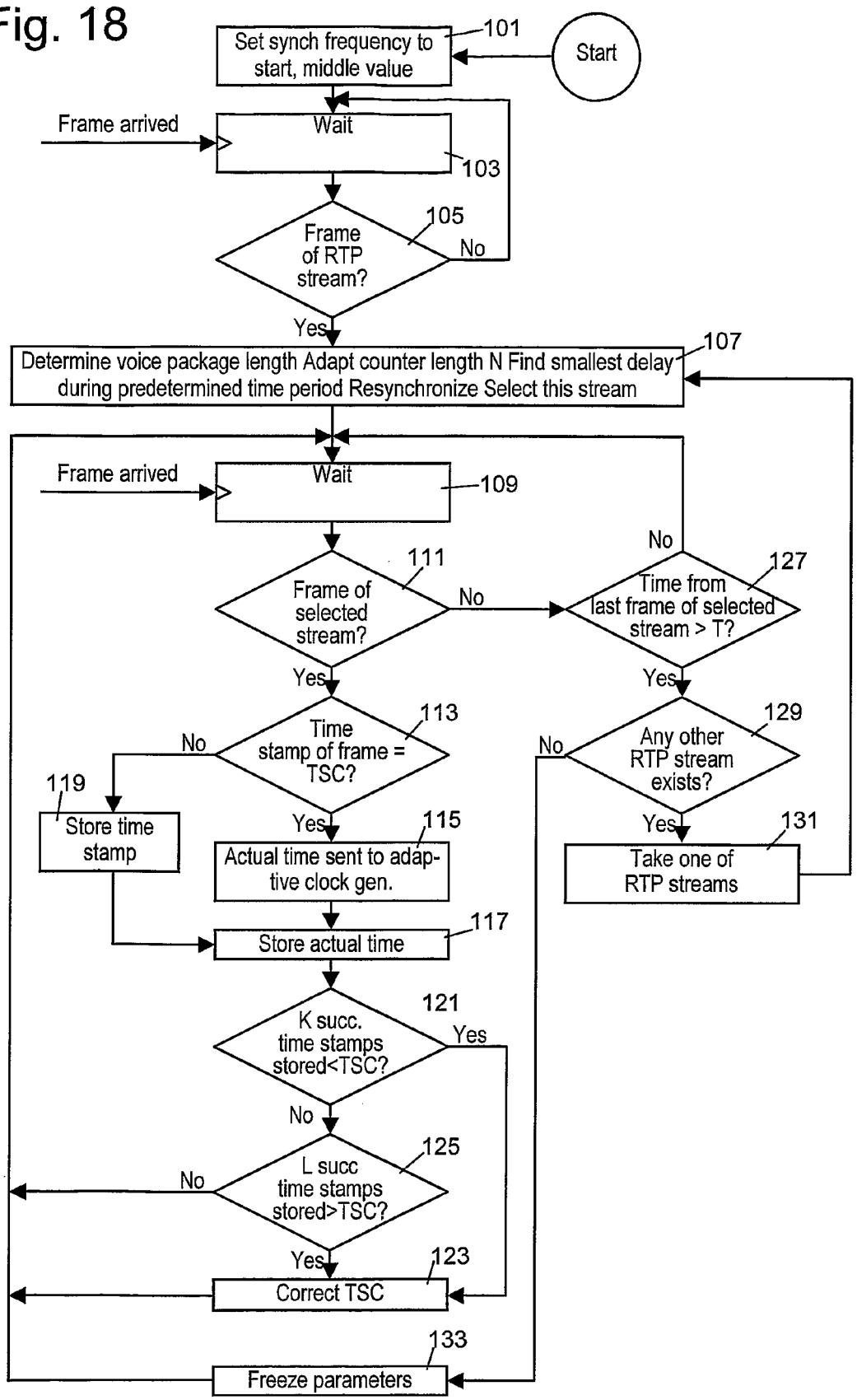
FIG. 18 is a flow chart of steps performed by an extraction unit.

The extraction unit 29 can execute a procedure illustrated by the flow chart of FIG. 18. Initially, the frequency of the reference clock signal is set to a nominal, middle value, as indicated in the block 101. In the case of FIG. 16 this means setting the counter 73 to be an x-bit counter where the integer x is chosen so that the output reference clock signal, as provided by the frequency dividing unit 75, has a frequency of e.g. exactly 8 MHz. When a frame is received, compare block 103, it is analyzed whether it can be used for synchronization in a block 105. If it cannot be used, another frame is awaited in block 103. If the received frame can be used, a block 107 is executed, in which the length of voice information in the frame is detected, i.e. the number of voice samples. The N-bit counter 37, 73 is adapted accordingly so that it wraps around in the same pace as packets from the same stream are expected. By sending appropriate commands to the minimum calculating unit 43, maintaining all parameters in the PLL at start values, the smallest delay of received packets in the same stream during a relatively long time period, typically one or a few seconds, is determined. Based thereon a resynchronization is made, so that from this smallest delay a suitable correction value is calculated and provided to the adder 41 or the N-bit counter 37. Possibly, other parameters are also set such as the window size of the minimum calculating unit 43 and the time constant of the PLL filter 45, 45'. The stream is finally selected by establishing a record for this stream and setting a pointer to this record in a memory, see FIG. 19.

A new frame is awaited in a block 109 and when it arrives it is determined in a block 111 whether it belongs to the selected stream. If it does, it is determined in a block 113 whether the time stamp of the frame is equal to the value of the TSC for this stream. It this is true, a block 115 is executed in which the actual time is sent to the adaptive clock generator, to the register 39. Then, the actual time is stored as an entry for this stream, as indicated in a block 117. If the time stamp does not match the TSC value, a block 119 is performed in which the time stamp and actual value of the TSC are stored. Then block 117 is performed.

In a block 121 it is asked whether there have been K successively received packets for which the time stamps are smaller than the corresponding TSC values, by analyzing the values, as stored in block 119. If it is true, the TSC value is corrected in a block 123 and then a new frame is awaited in block 109. If it is not true, it is asked in a block 125 whether there have been K successively received packets for which the time stamps are larger than the corresponding TSC values. If it is true, the block 123 is executed and a new frame is awaited in block 109. If it is not true, a new frame is awaited in block 109.

If it was determined in block 111 that the frame does not belong to the selected stream, it is determined in a block 127 whether there is a time-out for the packets of this stream, i.e. if a time period larger than some predetermined value has elapsed from the last reception of a frame of the selected stream, by analyzing the time stored in block 117. It if is not true, a new frame is awaited in block 109. If it is true, it is determined in a block 129 whether there exist another RTP stream that can be used for synchronization. If such a stream exists it is taken as the new stream to be used and in the case where more than one such streams exist, one thereof is taken in a block 131. Then a new frame is awaited in block 109. If no RTP stream exist, as determined in block 129, the parameters of the PLL are frozen, i.e. commanded not to be changed by sending suitable signals to the minimum value calculating unit 43 and the PLL filter 45, 45'. Then a new frame is awaited in block 109.

Figure 19:
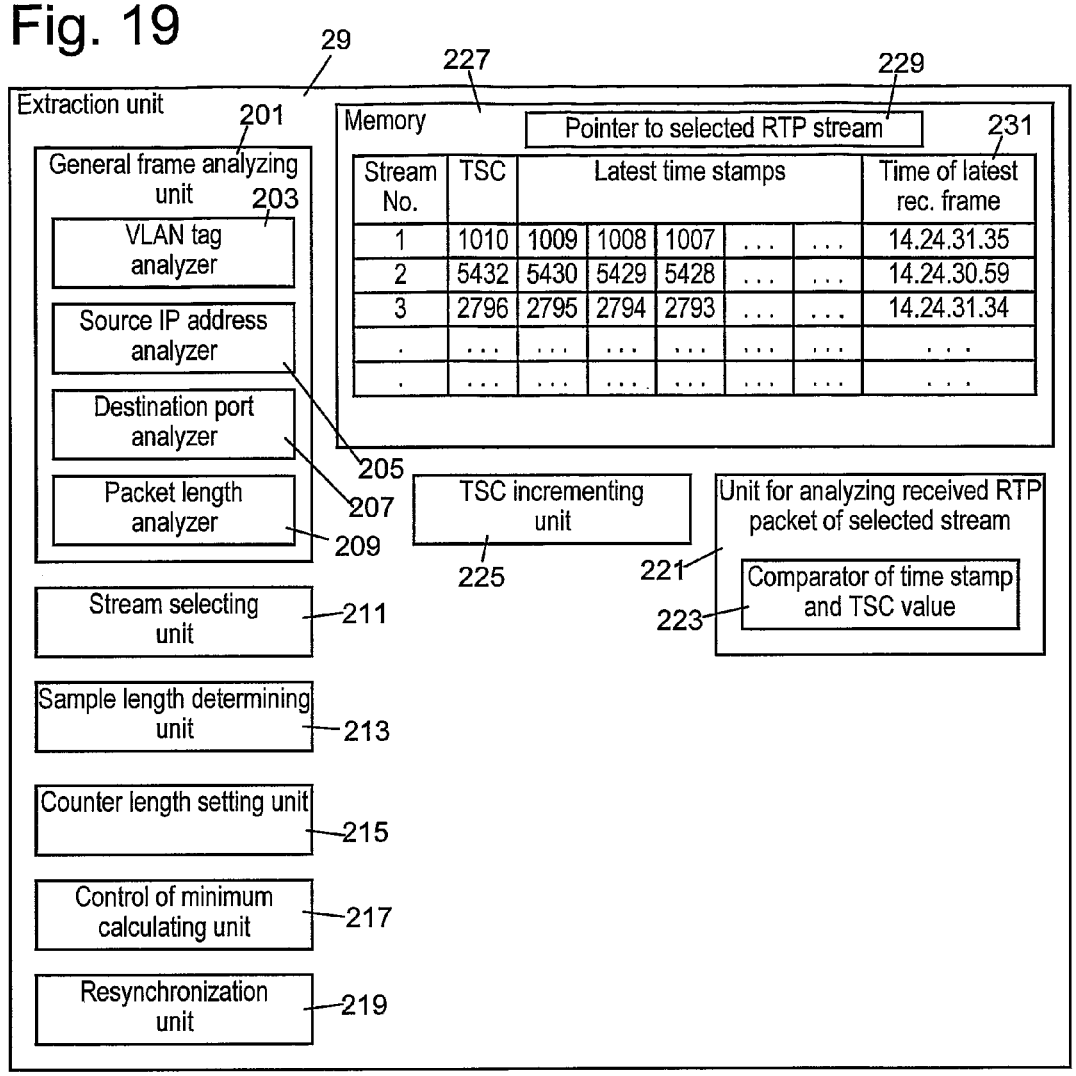
FIG. 19 is a block diagram of an extraction unit.

The basic units included in the extraction unit 29 are seen in the block diagram of FIG. 19. The extraction unit includes a general frame analyzing unit 201 used in selecting suitable packet streams. For that purpose it can in turn include analyzer modules such a VLAN tag analyzer 203, a source IP address analyzer 205, a destination port analyzer 207 and a packet length analyzer 209. A stream selecting unit 211 selects a suitable stream, such as guided by the results obtained from the general frame analyzing unit 201. A sample length determining unit 213 determines the length of the voice information in the packages of the selected stream and a counter length setting unit 215 connected thereto sends suitable commands to the N-bit counter 37 in the accordance with the determined package length. A unit 217 controls the minimum calculating unit by sending appropriate commands, e.g. for initialing, freezing or continuing, for setting the window size and for allowing it to run for a relatively long time only looking for the smallest value, i.e. the smallest delay. A resynchronization unit 219 performs the calculations necessary to produce parameters for resynchronization operations, receiving information from various other block and sending commands and values, such as an offset value to the adder 41.

Furthermore, a unit 221 is provided for analyzing, when there is a selected packet stream, the packets received in this stream. In particular, this unit includes a comparing unit 223 for comparing the time stamp of a received packet to the value of the TSC. A unit 225 is adapted to receive pulses from the PLL, from the N-bit counter 37 thereof, and then to increment the TSC of the selected stream by the value valid for this stream.

A memory 227 includes a memory cell 229 for storing a pointer to the selected stream. It also includes a table or small data base 231 of current RTP streams. For each stream, there are thus memory cells, not shown, for storing some identification of the stream so that the packets thereof can be recognized in the stream of incoming packets. There is for each stream a memory cell for its TSC and cells for holding values of time stamps of the latest received packets together with associated TSC values, not shown. There is also for each stream a memory cell in which the time when the last packet of the stream arrived.

The invention claimed is:

1. A forwarding unit for receiving Ethernet packets and forwarding information therein on a digital subscriber line, said forwarding unit comprising:
   a device for producing a clock signal, said device including:
      a selection unit for selecting at least one stream of received Ethernet packets, wherein the selection unit includes a general analyzing unit for analyzing received Ethernet packets to find a stream of packets from one destination to one user, the packets carrying real time information belonging to a real time service; and
      a clock signal generating unit for generating a reference clock signal according to arrival times of packets in the selected at least one stream, wherein the clock signal generating unit includes a delay determining unit for determining the delays of arrived packets in relation to the reference clock signal, wherein the delay determining unit includes:
         a signal generator providing a first clock signal having a frequency;
         a delay measuring counter configured to receive a signal obtained by dividing the first clock signal by a set number and to count the pulses of the received signal modulo a first number of times; and
         a measuring unit connected to the counter for determining, as a measure of the delays of the packets in relation to the reference clock signal, the counter value for the arrival time of each of the packets of the selected stream delays; and
      a modem connected to the digital subscriber line and to the clock signal generating unit, said modem including a Network Timing Reference (NTR) unit for receiving the reference clock signal for use in transmission of voice information to the digital subscriber line.

2. The forwarding unit according to claim 1, wherein the general analyzing unit includes means for analyzing a VLAN tag, a source IP address, and/or a destination port address of received packets to find suitable packet streams.

3. The forwarding unit according to claim 1, wherein the general analyzing unit includes means for analyzing the length of received packets to find suitable packet streams.

4. The forwarding unit according to claim 1, wherein the selection unit includes means for setting the length of a wrap-around number of the delay measuring counter so that the times for wrap-around are in accordance with expected arrival times of the packets of the selected stream and thus occur with the same frequency, wherein the means for setting the length of a wrap-around number sets the length based on the number of voice samples in packets of the selected stream.

5. The forwarding unit according to claim 1, wherein the clock signal generating unit includes a frequency dividing unit for receiving the first clock signal and providing the reference clock signal.

6. The forwarding unit according to claim 1, wherein the clock signal generating unit includes:
   a calculating unit for calculating from the determined delays, a correction of the frequency of the reference clock signal, wherein the calculating unit calculates a minimum of delays during a last time period of a set length; and
   an adjusting unit for adjusting the frequency of the reference clock signal according to the calculated correction.

7. The forwarding unit according to claim 6, characterized by a Phase Locked Loop (PLL) filter connected between the calculating unit and the adjusting unit for filtering the calculated correction, wherein the PLL filter has a time constant that is significantly larger than the time period of forwarding packets on the digital subscriber line.

8. The forwarding unit according to claim 1, further comprising a second analyzing unit for analyzing the packets of the selected stream for a time stamp for determining whether the time stamp of an arrived packet corresponds to the value of a time stamp counter incremented as commanded by a signal from the delay measuring counter, wherein the clock signal generating unit generates the reference clock signal according to arrival times of only packets for which such a correspondence is determined to exist.

9. The forwarding unit according to claim 1, wherein the clock signal generating unit includes:
   a calculating unit for calculating from the determined delays, a correction of the phase of the reference clock signal, wherein the calculating unit calculates a minimum of delays during a last time period of a set length; and
   an adjusting unit for adjusting the phase of the reference clock signal according to the calculated correction.

10. A method of producing a reference clock signal in a unit receiving Ethernet packets and forwarding them on a digital subscriber line, said method comprising the steps of:
   analyzing received Ethernet packets to select a stream of packets from one destination to one user, the packets carrying real time information belonging to a real time service;
   determining from arrival times of packets of said selected stream, delays in relation to a clock signal having a frequency, said step of determining the delays including:
      generating the clock signal by a signal generator;
      receiving by a delay measuring counter, a signal obtained by dividing the clock signal by a set number and counting the pulses of the received signal modulo a first number of times; and
      determining by a measuring unit connected to the counter, as a measure of the delays of the packets in relation to the reference clock signal, the counter value for the arrival time of each of the packets of the selected stream delays;
   calculating from the determined delays, a correction of the frequency of the clock signal; and
   adjusting the frequency of the reference clock signal according to the calculated correction.

11. The method according to claim 10, wherein the step of adjusting includes first providing the correction to a Phase Locked Loop (PLL) filter, wherein the PLL filter has a time constant that is significantly larger than the time period of forwarding packets on the digital subscriber line.

12. The method according to claim 10, further comprising the step of analyzing the packets of the selected stream for a time stamp for finding whether the packets arrive in a successive order, wherein the step of determining delays includes determining only arrival times of packets having arrived in a successive order.

* * * * *